(12) United States Patent
Basker et al.

(10) Patent No.: US 10,269,644 B2
(45) Date of Patent: *Apr. 23, 2019

(54) FIN PITCH SCALING FOR HIGH VOLTAGE DEVICES AND LOW VOLTAGE DEVICES ON THE SAME WAFER

(71) Applicant: INTERNATIONAL BUSINESS MACHINES CORPORATION, Armonk, NY (US)

(72) Inventors: Veeraraghavan S. Basker, Schenectady, NY (US); Kangguo Cheng, Schenectady, NY (US); Theodorus E. Standaert, Clifton Park, NY (US); Junli Wang, Slingerlands, NY (US)

(73) Assignee: INTERNATIONAL BUSINESS MACHINES CORPORATION, Armonk, NY (US)

(*) Notice: Subject to any disclaimer, the term of this patent is extended or adjusted under 35 U.S.C. 154(b) by 0 days.

This patent is subject to a terminal disclaimer.

(21) Appl. No.: 15/680,697

(22) Filed: Aug. 18, 2017

(65) Prior Publication Data
US 2017/0372968 A1    Dec. 28, 2017

Related U.S. Application Data

(62) Division of application No. 14/948,745, filed on Nov. 23, 2015, now Pat. No. 9,786,563.

(51) Int. Cl.
*H01L 21/84* (2006.01)
*H01L 27/12* (2006.01)
(Continued)

(52) U.S. Cl.
CPC .... *H01L 21/823412* (2013.01); *H01L 21/308* (2013.01); *H01L 21/3065* (2013.01);
(Continued)

(58) Field of Classification Search
CPC ............. H01L 29/66795; H01L 29/785; H01L 21/845; H01L 27/1211; H01L 27/0886; H01L 27/0924
See application file for complete search history.

(56) References Cited

U.S. PATENT DOCUMENTS

| 6,642,105 B2 | 11/2003 | Kim et al. |
| 7,169,670 B2 | 1/2007 | Lee et al. |

(Continued)

OTHER PUBLICATIONS

Office Action issued in U.S. Appl. No. 15/634,307, dated Feb. 8, 2018, pp. 1-14.
(Continued)

*Primary Examiner* — Ngan V Ngo
(74) *Attorney, Agent, or Firm* — Tutunjian & Bitetto, P.C.; Vazken Alexanian

(57) ABSTRACT

A semiconductor device is provided that includes a first plurality of fin structures having a first width in a first region of a substrate, and a second plurality of fin structures having a second width in a second region of the substrate, the second width being less than the first width. A first gate structure is formed on the first plurality of fin structures including a first high-k gate dielectric that is in direct contact with a channel region of the first plurality of fin structures and a first gate conductor. A second gate structure is formed on the second plurality of fin structures including a high voltage gate dielectric that is in direct contact with a channel region of the second plurality of fin structures, a second high-k gate dielectric and a second gate conductor.

18 Claims, 10 Drawing Sheets

(51) Int. Cl.
*H01L 29/10* (2006.01)
*H01L 29/51* (2006.01)
*H01L 29/66* (2006.01)
*H01L 29/78* (2006.01)
*H01L 21/308* (2006.01)
*H01L 27/088* (2006.01)
*H01L 27/092* (2006.01)
*H01L 29/423* (2006.01)
*H01L 21/3065* (2006.01)
*H01L 21/8234* (2006.01)

(52) U.S. Cl.
CPC ...... *H01L 21/3083* (2013.01); *H01L 21/3086* (2013.01); *H01L 21/823431* (2013.01); *H01L 21/823437* (2013.01); *H01L 21/823462* (2013.01); *H01L 21/823468* (2013.01); *H01L 21/845* (2013.01); *H01L 27/0886* (2013.01); *H01L 27/0924* (2013.01); *H01L 27/1211* (2013.01); *H01L 29/1037* (2013.01); *H01L 29/42364* (2013.01); *H01L 29/517* (2013.01); *H01L 29/66545* (2013.01); *H01L 29/66795* (2013.01); *H01L 29/785* (2013.01)

(56) References Cited

U.S. PATENT DOCUMENTS

| | | | |
|---|---|---|---|
| 7,763,531 B2 | 7/2010 | Abadeer et al. | |
| 7,932,152 B2 | 4/2011 | Wong et al. | |
| 7,994,603 B2 | 8/2011 | Wang et al. | |
| 8,492,228 B1 | 7/2013 | Leobandung et al. | |
| 8,722,494 B1 | 5/2014 | Basker et al. | |
| 8,927,432 B2 | 1/2015 | Guo et al. | |
| 9,780,091 B2 | 10/2017 | Basker et al. | |
| 9,786,563 B2 * | 10/2017 | Basker | H01L 27/0886 |
| 2012/0032732 A1 | 2/2012 | Xiao et al. | |
| 2013/0244392 A1 | 9/2013 | Oh et al. | |
| 2014/0353765 A1 | 12/2014 | Woo et al. | |
| 2016/0104705 A1 | 4/2016 | Chung et al. | |
| 2017/0054027 A1 * | 2/2017 | Liu | H01L 29/7855 |
| 2018/0012976 A1 | 1/2018 | Hsu et al. | |

OTHER PUBLICATIONS

List of IBM Patents or Patent Applications Treated as Related dated Aug. 18, 2017, 2 pages.

* cited by examiner

FIN PITCH SCALING FOR HIGH VOLTAGE DEVICES AND LOW VOLTAGE DEVICES ON THE SAME WAFER

BACKGROUND

Technical Field

The present disclosure relates to semiconductor devices, such as semiconductor devices including fin structures. The present disclosure further relates to processing of fin including structures for use in devices having different applied voltages.

Description of the Related Art

The dimensions of semiconductor field effect transistors (FETs) have been steadily shrinking over the last thirty years or so, as scaling to smaller dimensions leads to continuing device performance improvements. Planar FET devices typically have a conducting gate electrode positioned above a semiconducting channel, and electrically isolated from the channel by a thin layer of gate oxide. Current through the channel is controlled by applying voltage to the conducting gate. With conventional planar FET scaling reaching fundamental limits, the semiconductor industry is looking at more unconventional geometries that will facilitate continued device performance improvements. One such class of device is a fin field effect transistor (finFET).

SUMMARY

In one aspect, a method of forming a semiconductor device is provided that includes fin structures having different pitches for devices having different applied voltages on a same semiconductor substrate, i.e., wafer. In some embodiments, the method of forming a semiconductor device may begin with forming a plurality of spacers having a first width using spacer image transfer, wherein the plurality of spacers are for patterning a plurality of fin structures from a semiconductor containing substrate. A block mask is formed over a first grouping of spacers in a first region of the semiconductor containing substrate. An isotropic etch is applied to a second grouping of spacers not covered by the block mask, wherein the isotropic etch reduces a width of at least one spacer in the second group of spacers to a second width that is less than the first width. The block mask is removed, and said plurality of fin structures are etched from the semiconductor containing substrate using the first grouping of spacers having the first width and the second grouping of spacers having the second width. A first plurality of fin structure having said first width etched using the first grouping of spacers provides first fin structure for semiconductor devices having a first applied voltage. A second plurality of fin structures having said second width etched using the second grouping of spacers provides second fin structures for semiconductor devices having a second applied voltage that is greater than the first applied voltage.

In another embodiment, a method of forming a semiconductor device is provided that includes fin structures having different pitches for devices having different applied voltages on a same semiconductor substrate, i.e., wafer. In some embodiments, the method of forming a semiconductor device may begin with forming a plurality of fin structures each having a first width using spacer image transfer. A block mask is formed over a first grouping of fin structures in a first region of the semiconductor substrate. An isotropic etch is applied to a second grouping of fin structures not covered by the block mask, wherein the isotropic etch reduces a width of at least one fin structure in the second group of fin structures to a second width that is less than the first width. The block mask is removed. The first grouping of fin structures is processed to provide first semiconductor devices having a first applied voltage. The second grouping of fin structures is processed to provide second semiconductor devices having a second applied voltage that is greater than the first applied voltage.

In another aspect of the present disclosure, a semiconductor device is provided that includes a first plurality of fin structures having a first width in a first region of a substrate, and a second plurality of fin structures having a second width in a second region of the substrate, the second width being less than the first width, wherein the first plurality of fin structures and the second plurality of fin structures have substantially a same pitch. A first gate structure is formed on the first plurality of fin structures including a first high-k gate dielectric that is in direct contact with a channel region of the first plurality of fin structures and a first gate conductor. A second gate structure is formed on the second plurality of fin structures including an oxide gate dielectric that is in direct contact with a channel region of the second plurality of fin structures, a second high-k gate dielectric and a second gate conductor.

BRIEF DESCRIPTION OF DRAWINGS

The following detailed description, given by way of example and not intended to limit the disclosure solely thereto, will best be appreciated in conjunction with the accompanying drawings, wherein like reference numerals denote like elements and parts, in which.

DETAILED DESCRIPTION OF THE PREFERRED EMBODIMENTS

Figure 1:
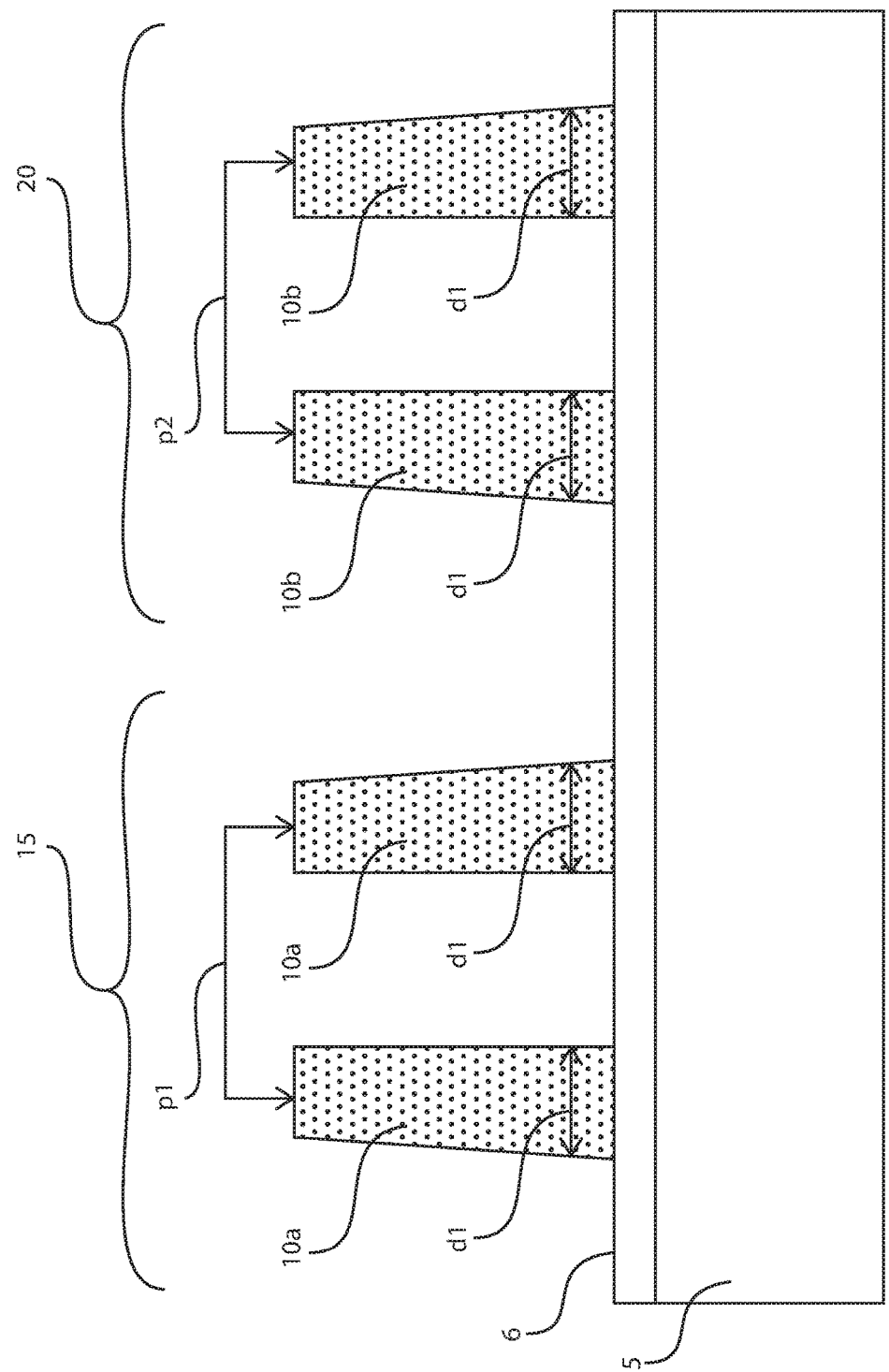
FIG. 1 is a side cross-sectional view depicting a plurality of spacers present over a semiconductor structure formed using spacer image transfer (SIT), in accordance with one embodiment of the present disclosure.

Detailed embodiments of the claimed structures and methods are disclosed herein; however, it is to be understood that the disclosed embodiments are merely illustrative of the claimed structures and methods that may be embodied in various forms. In addition, each of the examples given in connection with the various embodiments is intended to be illustrative, and not restrictive. Further, the figures are not necessarily to scale, some features may be exaggerated to show details of particular components. Therefore, specific structural and functional details disclosed herein are not to be interpreted as limiting, but merely as a representative basis for teaching one skilled in the art to variously employ the methods and structures of the present disclosure. For purposes of the description hereinafter, the terms "upper", "lower", "right", "left", "vertical", "horizontal", "top", "bottom", and derivatives thereof shall relate to the embodiments of the disclosure, as it is oriented in the drawing figures. The terms "positioned on" means that a first element, such as a first structure, is present on a second element, such as a second structure, wherein intervening elements, such as an interface structure, e.g. interface layer, may be present between the first element and the second element. The term "direct contact" means that a first element, such as a first structure, and a second element, such as a second structure, are connected without any intermediary conducting, insulating or semiconductor layers at the interface of the two elements.

In some embodiments, the methods and structures disclosed herein form FinFET semiconductor devices in the width of the fin structures have been processed according to whether the FinFET is used in a high voltage application or a low voltage application. A field effect transistor (FET) is a semiconductor device in which output current, i.e., source-drain current, is controlled by the voltage applied to a gate structure to the semiconductor device. A field effect transistor has three terminals, i.e., gate structure, source region and drain region. As used herein, a "fin structure" refers to a semiconductor material, which is employed as the body of a semiconductor device, in which the gate structure is positioned around the fin structure such that charge flows down the channel on the two sidewalls of the fin structure and optionally along the top surface of the fin structure. A finFET is a semiconductor device that positions the channel region of the semiconductor device in a fin structure. The source and drain regions of the fin structure are the portions of the fin structure that are on opposing sides of the channel region of the fin structure.

It has been determined, that the integration flow for forming oxide dielectrics for gate structures used in high voltage applications of FinFET structures can result in different FIN widths (Dfin) for the final device structure when compared to the fin width of the FinFET structures used in lower voltage applications. This can be due to the downstream process used in forming the FinFETs, e.g., thermal process for forming the oxide layer of the gate structure in the high voltage devices, and the oxidation stripping process for removing the oxide layer in the low voltage devices. This can result in a smaller width for the fin structure for the low voltage devices and a larger fin width for the high voltage semiconductor devices. The presence of oxide gate dielectric layer on the fin structures of the high voltage semiconductor devices further reduces the space for work function metal (WFM) fill.

It has been determined that the above conditions can require a bigger fin pitch for the high voltages devices in comparison to the pitch separating adjacent fin structures for low voltage devices in order to avoid work function metal (WFM) pinchoff between the fin structures for the high voltage devices. As used herein, the "pitch" is the center to center distance separating adjacent fin structures having a parrallel length. As fin scaling increases, integration of different pitches for fin structures for low voltage and high voltage devices on the same semiconductor substrate, e.g., system on chip (SOC), will result in extremely increased integration complexity and variation, e.g., litho RET optimization and worse pitch walking etc. Resolution enhancement technologies (RET) are methods used to modify photomasks for integrated circuits (ICs) to compensate for limitations in the lithographic processes used to manufacture the chips.

In some embodiments, the methods and structures provided in the present disclosure provide for one black mask and etch process being added to a fin structure forming sequence to trim the fin width (Dfin) of the fin structures being used for high voltage applications prior to forming the gate oxide layer deposition. This provides that the fin width (Dfin) for the fin structures for the high voltage (EG) devices is less than the fin width (Dfin) of the fin structures for the low voltage (SG) devices. With downstream processing, there may be Dfin loss, i.e., a reduction in fin width, for low voltage devices, but not in the high voltage (EG) devices. In some embodiments, in the methods and structures of the present disclosure, following formation of the final gate structure, i.e., post replacement metal gate (RMG) processing, structurally the width of the fin structures (Dfin) for the high voltage (EG) semiconductor devices will be equal or less than the width of the fin structure (Dfin) for the low voltage (SG) semiconductor devices. This will enable further high voltage (EG) fin pitch scaling than that by conventional integration flow. The methods and structures of the present disclosure are now discussed with more detail referring to FIGS. 1-10.

FIG. 1 depicts a plurality of spacers 10a, 10b present over a semiconductor structure, e.g., semiconductor substrate 5, formed using spacer image transfer (SIT). In some embodiments, a hardmask layer 6 may be present between the semiconductor substrate 5 and the plurality of spacers 10a, 10b. In some embodiments, a first plurality of spacers 10a is present in a first region 15 of the semiconductor substrate 5 that is later processed to provide low voltage (SD) semiconductor devices; and a second plurality of spacers 10b is present in a second region 20 of the semiconductor substrate 5 that is later processed to provide high voltage (EG) semiconductor devices.

The semiconductor substrate 5 may be a bulk semiconductor substrate. In some embodiments, the semiconductor substrate 5 may be composed of a type IV semiconductor material or a compound semiconductor material. By "type IV semiconductor" it is meant that the semiconductor material includes at least one element from Group IVA (i.e., Group 14) of the Periodic Table of Elements. Examples of type IV semiconductor materials that are suitable for the fin structure include silicon (Si), germanium (Ge), silicon germanium (SiGe), silicon doped with carbon (Si:C), silicon germanium doped with carbon (SiGe:C) and a combination thereof. Typically, the semiconductor substrate 5 is composed of silicon (Si), e.g., single crystal silicon. One example of a compound semiconductor material suitable for the semiconductor substrate is a III-V semiconductor material. The term "III-V compound semiconductor" denotes a semiconductor material that includes at least one element from Group III of the Periodic Table of Elements and at least one element from Group V of the Periodic Table of Elements. Typically, the III-V compound semiconductors are binary, ternary or quaternary alloys including III/V elements. Examples of III-V compound semiconductors that can be used in the present invention include, but are not limited to alloys of gallium arsenic (GaAs), aluminum arsenic (AlAs), indium gallium arsenic (InGaAs), indium aluminum arsenic (InAlAs), indium aluminum arsenic antimony (InAlAsSb), indium aluminum arsenic phosphorus (InAlAsP), indium gallium arsenic phosphorus (InGaAsP) and combinations thereof.

In some embodiments, the semiconductor substrate may be a bulk substrate, as depicted in FIG. 1, or the semiconductor substrate may be a semiconductor on insulator (SOI) substrate. In an SOI substrate, a semiconductor on insulator (SOI) layer, such as a silicon layer, is present atop a buried dielectric layer, such as a silicon oxide layer, wherein the buried dielectric layer is present atop a base semiconductor layer. Any of the aforementioned semiconductor materials used for the semiconductor substrate may provide the composition of the SOI layer or the base semiconductor layer.

The hardmask dielectric layer 6 may be composed of any dielectric material, such as an oxide, nitride or oxynitride material. For example, when the hardmask dielectric layer 6 is an oxide, the hardmask dielectric layer 6 may be silicon oxide. In another example, when the hardmask dielectric layer 6 is a nitride, the hardmask dielectric layer 6 may be composed of silicon nitride. It is noted that the above compositions for the hard mask dielectric layer are provided for illustrative purposes only, as other dielectric materials typically used in semiconductor devices are equally applicable, such as aluminum oxide, silicon carbon boron nitride (SiCBN), hafnium oxide, etc. The hardmask dielectric layer 6 may have a thickness of 1 nm to 10 nm, and may be deposited using a chemical vapor deposition (CVD) process, such as plasma enhanced chemical vapor deposition (PECVD) or metal organic chemical vapor deposition (MOCVD). In some embodiments, the hardmask dielectric layer 6 may be omitted.

Still referring to FIG. 1, the spacers 10a, 10b may be formed atop the substrate 10 using a spacer image transfer process. The SIT process can include forming a mandrel material layer (not shown) on the material layer that provides the fin structures, such as the SOI layer of an SOI substrate, or the bulk semiconductor substrate 5 upper surface. The mandrel material layer can include any material (semiconductor, dielectric or conductive) that can be selectively removed from the structure during a subsequently performed etching process. In one embodiment, the mandrel material layer may be composed of amorphous silicon or polysilicon. In another embodiment, the mandrel material layer may be composed of a metal, such as, e.g., aluminum (Al), tungsten (W), or copper (Cu). The mandrel material layer can be formed by a deposition method, such as chemical vapor deposition or plasma enhanced chemical vapor deposition. In one embodiment, the thickness of the mandrel material layer can be from 50 nm to 300 nm. Following deposition of the mandrel material layer, the mandrel material layer can be patterned by lithography and etching to form a plurality of mandrel structures over the topmost surface of the semiconductor containing material, e.g., overlying the semiconductor substrate 1, that provides the fin structures.

The SIT process may continue by forming a dielectric spacer 10a, 10b on each sidewall of each mandrel structure. The dielectric spacer 10a, 10b can be formed by deposition of a dielectric spacer material, and then etching the deposited dielectric spacer material. The dielectric spacer material may comprise any dielectric spacer material such as, for example, silicon dioxide, silicon nitride or a dielectric metal oxide. Examples of deposition processes that can be used in providing the dielectric spacer material include, but are not limited to, chemical vapor deposition (CVD), plasma enhanced chemical vapor deposition (PECVD), or atomic layer deposition (ALD). Examples of etching that be used in providing the dielectric spacers include any etching process, such as, e.g., reactive ion etching (RIE). Since the dielectric spacers 10a, 10b are used in the SIT process as an etch mask, the width of the each dielectric spacer 10a, 10b determines the width of each fin structure.

In some embodiments, the dielectric spacers 10a, 10b at this stage of the process flow have a width D1 of less than 20 nm, as measured at the base of the dielectric spacers 10a, 10b. In another embodiment, the dielectric spacers 10a, 10b have a width D1 ranging from 5 nm to 20 nm.

In some embodiments, after formation of the dielectric spacers 10a, 10b, the SIT process continues by removing each mandrel structure. Each mandrel structure can be removed by an etching process that is selective for removing the mandrel material as compared to silicon.

In some embodiments, adjacent dielectric spacers 10a, 10b may be separated by a pitch P1, P2, ranging from 10 nm to 500 nm. In another example, the pitch P1, P2 separating adjacent dielectric spacers 10a, 10b may range from 20 nm to 50 nm. In this example, the pitch P1 of the adjacent dielectric spacers 10a in the first region 15 of the semiconductor substrate 5 is substantially the same as the pitch P2 of the adjacent dielectric spacers 10b in the second region 20 of the semiconductor substrate 5.

Figure 2:
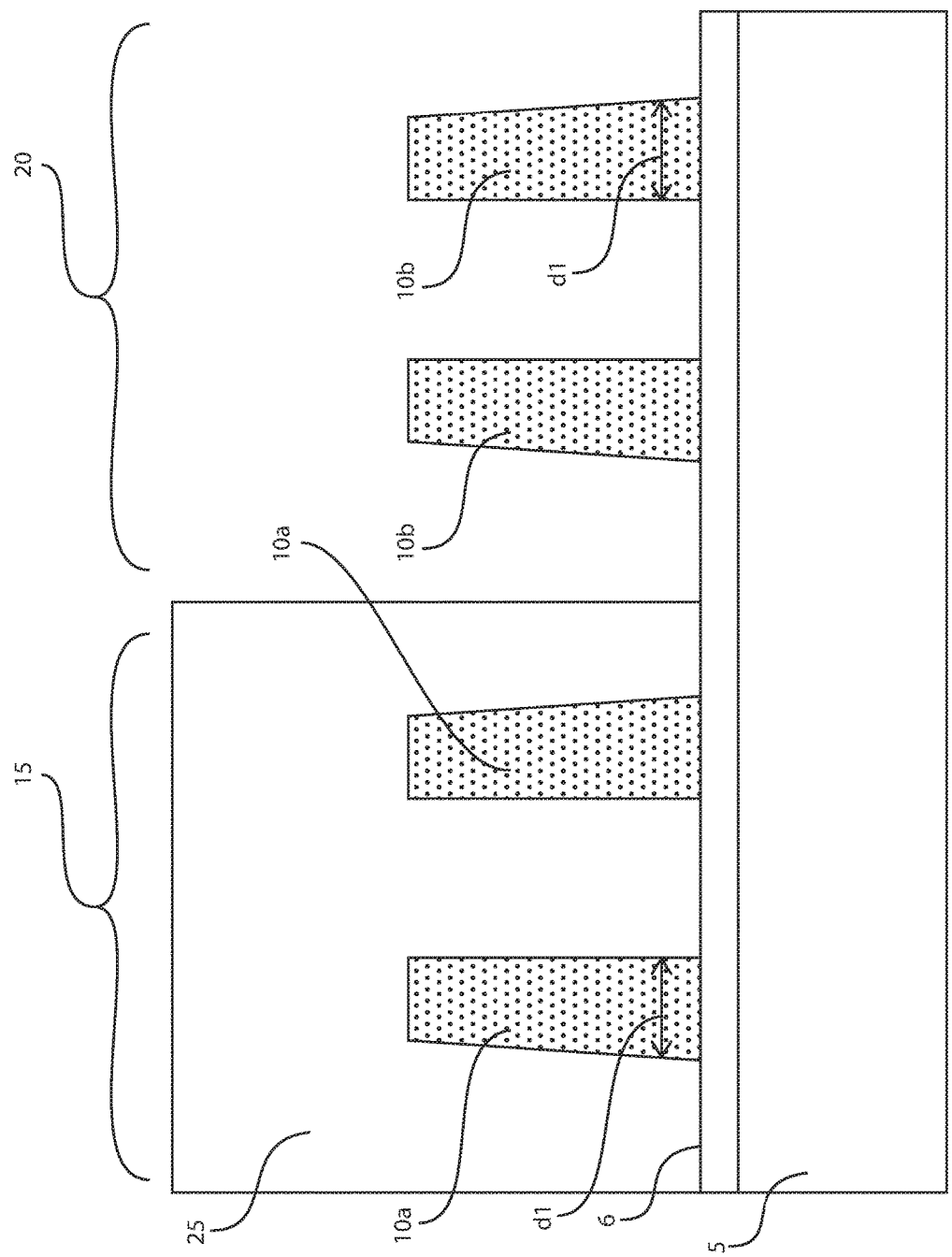
FIG. 2 is a side cross-sectional view depicting forming a block mask over a first grouping of spacers in a first region of the semiconductor containing substrate, in accordance with one embodiment of the present disclosure.

FIG. 2 depicts forming a block mask 25 over a first grouping of dielectric spacers 10a in a first region 15 of the semiconductor containing substrate 5. The block mask 25 does not cover the second grouping of dielectric spacers 10b in the second region 20 of the semiconductor containing substrate 5 leaving them exposed. The block mask 25 may comprise soft and/or hardmask materials and can be formed using deposition, photolithography and etching. In one embodiment, the block mask 25 comprises a photoresist. A photoresist block mask can be produced by applying a photoresist layer, exposing the photoresist layer to a pattern of radiation, and then developing the pattern into the photoresist layer utilizing conventional resist developer. Typically, the block masks have a thickness ranging from 100 nm to 300 nm.

Figure 3:
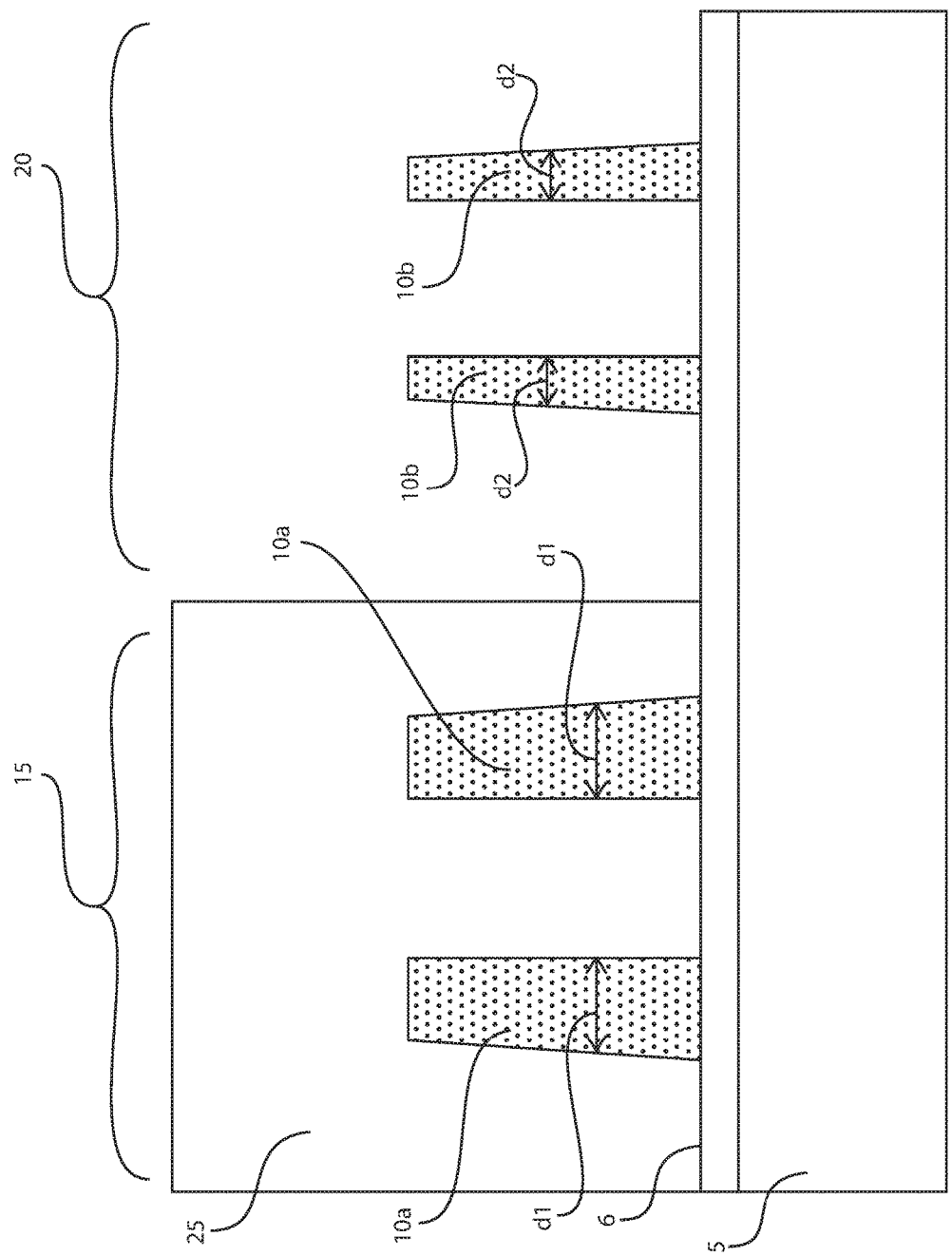
FIG. 3 is a side cross-sectional view depicting one embodiment of an isotropic etch applied to the second grouping of spacers not covered by the block mask, wherein the isotropic etch reduces a width of at least one spacer in the second group of spacers to a second width that is less than the first width, in accordance with the present disclosure.

FIG. 3 depicts one embodiment of an isotropic etch applied to the second grouping of spacers 10b not covered by the block mask 25, wherein the isotropic etch reduces a width of at least one spacer 10b in the second group of spacers to a second width D2 that is less than the first width D1. Contrary to anisotropic etching, in which the etch rate in one direction exceeds the remaining directions, in isotropic etching the etch rate in substantially all directions is substantially the same. One example of isotropic etching processes suitable for etching the second group of spacers to the second width D2 may be plasma etching.

In one embodiment, the isotropic etching of the second group of spacers 10b may laterally remove 1 nm to 4 nm from each sidewall of each spacer, which reduces the overall width of each of the spacers in the second group of spacers 10b by 2 nm to 8 nm. In another embodiment, the isotropic etching of the second group of spacers 10b may laterally remove 2 nm to 3 nm from each sidewall of each spacer, which reduces the overall width of each of the spacers in the second group of spacers 10b by 4 nm to 6 nm. In some embodiment, the second width D2 for each of the dielectric spacers 10b at this stage of the present disclosure may be less than 15 nm, as measured at the base of the dielectric spacers 10b. In another embodiment, the dielectric spacers 10b have a width D2 that is 2 nm to 5 nm less than the first width D1. Following the isotropic etching of the second group of spacers 10b, the block mask 25 may be removed by selective etching, chemical stripping or oxygen ashing, as depicted in FIG. 4.

Figure 4:
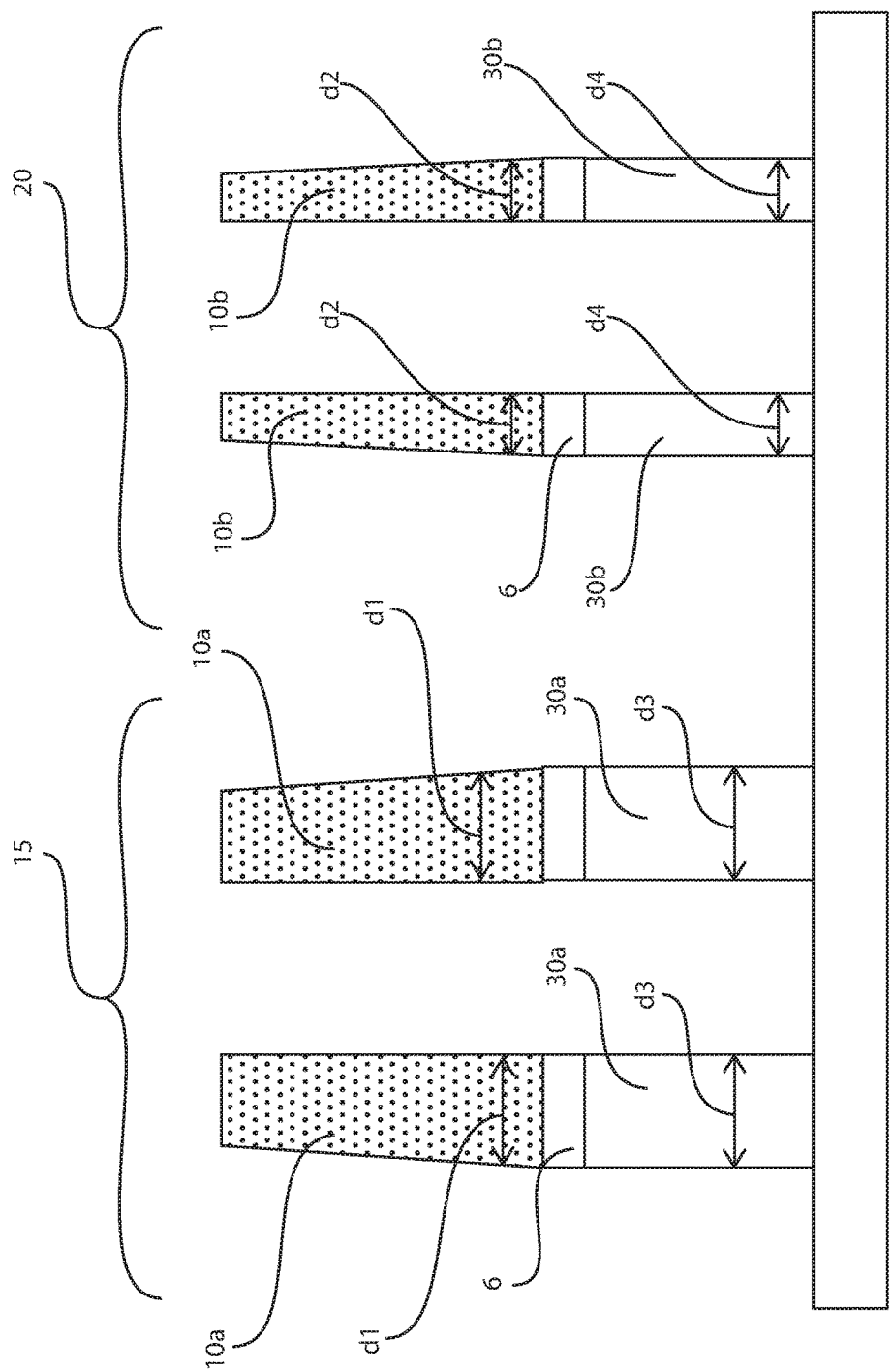
FIG. 4 is a side cross-sectional view depicting removing the block mask, and etching a plurality of fin structures from the semiconductor containing substrate using the first grouping of spacers having the first width and the second grouping of spacers having the second width, in accordance with one embodiment of the present disclosure.

FIG. 4 depicts one embodiment of etching a plurality of fin structures 30a, 30b from the semiconductor containing substrate 5 using the first grouping of spacers 10a having the first width D1 and the second grouping of spacers 10b having the second width D2 as an etch mask. The etch process for etching the semiconductor containing substrate 5 to form the first and second group of fin structures 30a, 30b may be an anisotropic etch. As used herein, an "anisotropic etch process" denotes a material removal process in which the etch rate in the direction normal to the surface to be etched is greater than in the direction parallel to the surface to be etched. The anisotropic etch may include reactive-ion etching (RIE). Reactive Ion Etching (RIE) is a form of plasma etching in which during etching the surface to be etched is placed on the RF powered electrode. Moreover, during RIE the surface to be etched takes on a potential that accelerates the etching species extracted from plasma toward the surface, in which the chemical etching reaction is taking place in the direction normal to the surface. Other examples of anisotropic etching that can be used at this point of the present disclosure include ion beam etching, plasma etching or laser ablation. The etch process may also be timed and/or employ end point detection methods to determine when the etch process has recessed the exposed surfaces of the semiconductor containing substrate 5 sufficiently to provide the desired height of the fin structures 30a, 30b. The etch process is typically a selective etch. The term "selective" as used to describe a material removal process denotes that the rate of material removal for a first material is greater than the rate of removal for at least another material of the structure to which the material removal process is being applied. For example, in one embodiment, a selective etch may include an etch chemistry that removes a first material selectively to a second material by a ratio of 100:1 or greater. In the embodiment depicted in FIG. 4, the etch process removes the material of the semiconductor containing substrate 5, and the hard mask dielectric 6, selectively to the dielectric spacers 10a, 10b.

The fin structures 30a, 30b may have a height H1 ranging from 5 nm to 200 nm. In another embodiment, the fin structures 30a, 30b may have a height H1 ranging from 10 nm to 100 nm. The fin structures 30a, 30b have a width D3, D4 that is dictated by the width D1, D2 of the first and second plurality of spacers 10a, 10b. For example, the first width D1 of the first plurality of spacers 10a dictates the width D3 of the first plurality of fin structures 30a, and the second width D2 of the second plurality of spacer 10b dictates the width D4 of the second plurality of fin structures 30b. The pitch separating adjacent fin structures 30a, 30b is also set by the pitch P1, P2 separating the adjacent dielectric spacers 10a, 10b.

In some embodiments, the fin structures 30a, 30b may be composed of a silicon including material that provides the semiconductor substrate 1, which may include, but is not limited to silicon, single crystal silicon, multicrystalline silicon, polycrystalline silicon, amorphous silicon, strained silicon, silicon doped with carbon (Si:C), silicon alloys or any combination thereof. The fin structures 30a, 30b may also be composed of germanium including semiconductor materials, such as silicon germanium (SiGe) or germanium (Ge). The fin structures 30a, 30b may also be composed of a type III-V semiconductor material, such as gallium arsenide (GaAs).

In some embodiments, the space between the adjacent fin structures 30a, 30b is filled with a dielectric material (not shown), which may be referred to as dielectric regions or isolation regions). The dielectric regions may be composed of a nitride, oxide, oxynitride material, and/or any other suitable dielectric layer. For example, when the dielectric regions are composed of an oxide, the dielectric regions can be silicon oxide ($SiO_2$). In another example, when the dielectric regions are composed of a nitride, the dielectric regions can be silicon nitride. The dielectric regions can be formed by a deposition process, such as CVD. Variations of CVD processes include, but not limited to, Atmospheric Pressure CVD (APCVD), Low Pressure CVD (LPCVD) and PECVD, Metal-Organic CVD (MOCVD) and combinations thereof. Alternatively, the dielectric regions 6 may be formed using a growth process, such as thermal oxidation or thermal nitridation.

The dielectric regions may be recessed using a selective etch process to provide an exposed portion of the upper portion of the fins structures 30a, 30b. In some embodiments, the dielectric regions are removed by an etch that is selective to the fin structures 5. The etch process for removing the dielectric regions may be an anisotropic etch or an isotropic etch. In some examples, the etch process may be a wet chemical etch, reactive ion etch (RIE), plasma etch, laser etch and combinations thereof.

The dielectric spacers 10a, 10b, as well as the remaining portions of the hard mask layer 6, may be removed using a selective etch process. Planarization may also remove the dielectric spacers 10a, 10b. Following removal of the dielectric spacers a gate structure may be formed on the channel region of the fin structures. The gate structure may be at least a partial replacement gate structure including at least one sacrificial element. The term "sacrificial" as used to describe the replacement gate conductor and replacement gate dielectric denotes that the structure is present during the process sequence, but is not present in the final device structure, in which the replacement structure provides an opening that dictates the size and geometry of a later formed functional gate conductor and functional gate dielectric.

Figure 5:
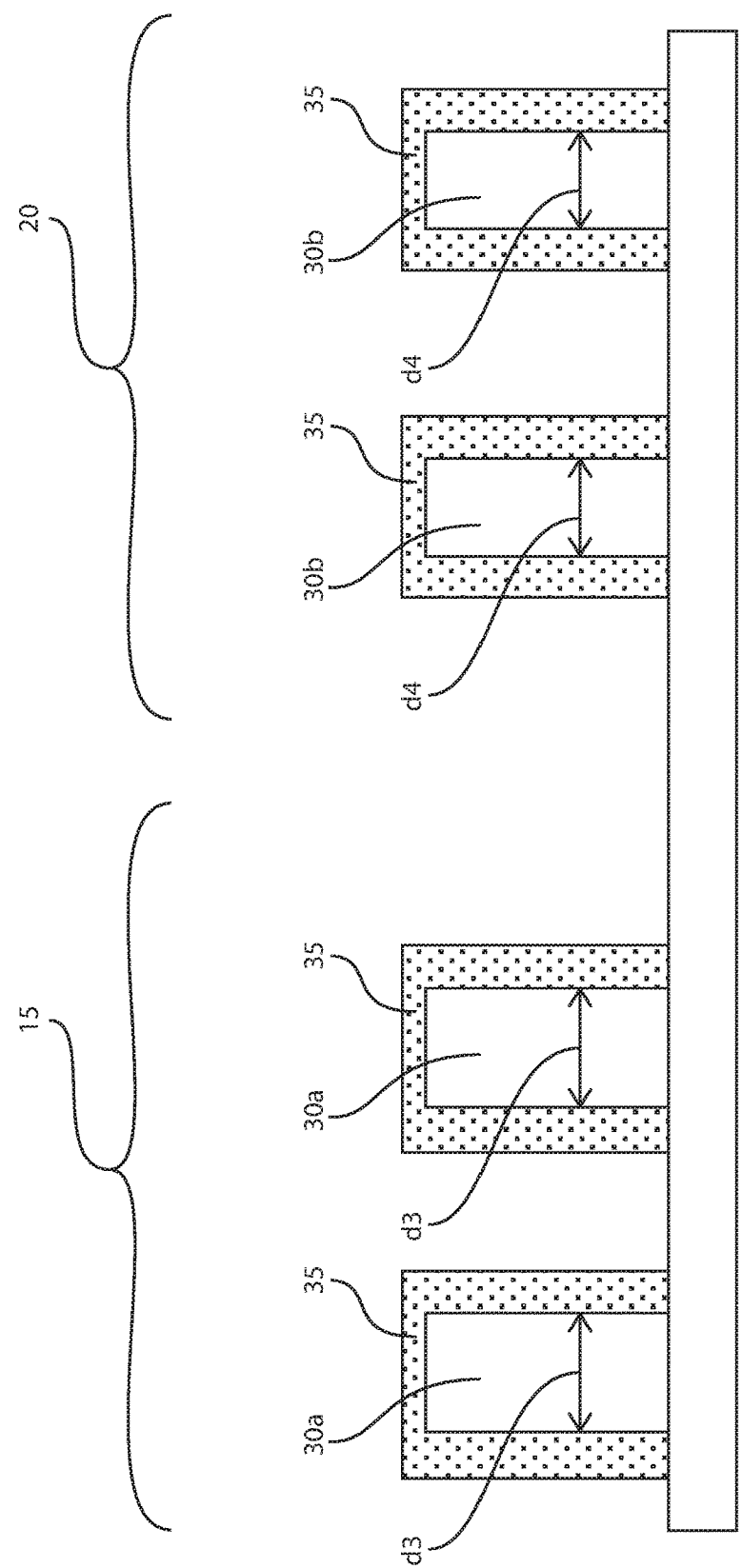
FIG. 5 is a side cross-sectional view depicting forming an oxide layer for a gate dielectric of a high voltage semiconductor device on both of the first and second plurality of fin structures, in accordance with one embodiment of the present disclosure.

In the embodiment depicted in FIG. 5, an oxide layer 35 is deposited on the first grouping of fin structures and the second grouping of fin structures. It is noted that the composition of the oxide layer and its thickness is selected for high voltage applications. Therefore, it is not entirely necessary that the oxide layer 35 be an oxide, and is hereafter referred to as high voltage dielectric layer 35. The high voltage dielectric layer 35 that is present on the first group of fin structures 30a is later removed to provide a gate structure suitable for low voltage semiconductor devices. Therefore, the high voltage dielectric layer 35 that is present on the first group of fin structures 30a is part of the replacement gate structure in the first region 15 of the substrate. The high voltage dielectric layer 35 that is present on the second group of fin structures 30b remains in the final gate structure that is present in the second region 20 of the semiconductor substrate 5, which is suitable for high voltage semiconductor devices. Therefore, the high voltage dielectric layer 35 that is present on the second group of fin structures 30b is part of a functional gate structure in the second region 25 of the substrate. The "functional gate structure" operates to switch the semiconductor device from an "on" to "off" state, and vice versa. The functional gate structure typically includes at least on gate dielectric and at least one gate conductor.

The high voltage dielectric layer 35 may be composed of any dielectric material. For example, the high voltage dielectric layer 35 may be composed of an oxide, such as silicon oxide. Silicon oxide is only one example of a dielectric composition that is suitable for the high voltage dielectric layer 35. The dielectric composition of the high voltage dielectric layer may also be composed of other oxides, such as aluminum oxide and hafnium oxide; carbon doped oxide dielectrics comprised of Si, C, O, and H (SiCOH); nitrides such as silicon nitride, boron nitride, silicon carbon boron nitride (SiCBN), and oxynitrides such as silicon oxynitride, silicon carbon oxynitride, hafnium oxynitride; as well as combinations thereof. The high voltage dielectric layer 35 may be deposited using chemical vapor deposition. Examples of chemical vapor deposition that are suitable for forming the high voltage dielectric layer 35 include chemical vapor deposition (CVD), plasma enhanced chemical vapor deposition (PECVD), physical vapor deposition (PVD), atomic layer deposition (ALD) and other like deposition processes. The high voltage dielectric layer 35 may also include material layers formed using a thermal growth process, such as thermal oxidation. The high voltage dielectric layer 35 may have a thickness ranging from 3 nm to 10 nm. In some embodiments, the high voltage dielectric layer 35 has a thickness that ranges from 3 nm to 5 nm.

In some embodiments, the high voltage dielectric layer 35 may be blanket deposited on the entire substrate including the first grouping of fin structures 30a, the second grouping of fin structures 30b, wherein an etch process is utilized to remove the portion of the high voltage dielectric layer 35 that is present between the adjacent fin structures 30a, 30b.

A sacrificial gate conductor may be formed on the high voltage dielectric layer 35. The sacrificial gate conductor is a component of the replacement gate structure for each of the first and second plurality of fin structures 30a, 30b. The sacrificial material that provides the sacrificial gate structure may be composed of any material that can be etched selectively to the underlying fin structures 30a in the first region 15 of the semiconductor substrate 1, and the high voltage dielectric layer 35 that is present in the second region 25 of the semiconductor substrate 1. In one embodiment, the sacrificial material that provides the sacrificial gate conductor may be composed of a silicon-containing material, such as polysilicon. Although, the sacrificial gate conductor is typically composed of a semiconductor material, the sacrificial gate conductor may also be composed of a dielectric material, such as an oxide, nitride or oxynitride material, or amorphous carbon. The sacrificial material may be patterned and etched to provide the sacrificial gate conductor. Specifically, and in one example, a pattern is produced by applying a photoresist to the surface to be etched, exposing the photoresist to a pattern of radiation, and then developing the pattern into the photoresist utilizing a resist developer. Once the patterning of the photoresist is completed, the sections if the sacrificial material covered by the photoresist are protected to provide the sacrificial gate conductor, while the exposed regions are removed using a selective etching process that removes the unprotected regions. Following formation of sacrificial gate conductor, the photoresist may be removed. At least one dielectric gate spacer may then be formed on the sidewall of the sacrificial gate structures. In one embodiment, the dielectric gate spacer may be formed by using a blanket layer deposition, such as CVD, and an anisotropic etchback method.

Following formation of the sacrificial gate structures, the source and drain regions may be formed. The source and drain regions are formed on the source and drain region portions of the fin structures. The source and drain region portions of the fin structures are the portions of the fin structures that are on opposing sides of the portion of the fin structure, i.e., channel portion, that the sacrificial gate structure is present on. As used herein, the term "drain" means a doped region in semiconductor device located at the end of the channel region, in which carriers are flowing out of the transistor through the drain. The term "source" is a doped region in the semiconductor device, in which majority carriers are flowing into the channel region. The channel region is the region between the source and drain of a semiconductor device that becomes conductive when the semiconductor device is turned on. The conductivity type of the source and the drain regions typically dictates the conductivity type of the semiconductor device. The term "conductivity type" refers to whether the device is n-type or p-type. The conductivity type of the source and drain regions typically dictate the conductivity type of the device. For example, if the source and drain regions are doped to an n-type conductivity, the semiconductor device may be referred to as an n-type conductivity device, such as an n-FinFET, and if the source and drain regions are doped to a p-type conductivity, the semiconductor device may be referred to as a p-type conductivity device, such as a p-FinFET.

The source and drain regions may be formed by ion implanting n-type or p-type dopant into the source and drain region portions of the fin structures 30a, 30b. The source and drain regions may be formed by forming in-situ doped n-type or p-type conductivity epitaxial semiconductor material on the source and drain region portions of the fin structures 30a, 30b. In some embodiments, a combination of ion implantation and in-situ doped n-type or p-type conductivity epitaxial semiconductor material may be employed to form the source and drain regions. Block masks may be utilized to isolate specific fin structures 30a, 30b for each conductivity type doping required.

The method may continue with replacing the sacrificial gate structures with functional gate structures 50a, 50b. Substituting the sacrificial gate structure with a functional gate structure may begin with forming an interlevel dielectric layer may be formed overlying the structure, and planarizing the interlevel dielectric layer to be coplanar with an upper surface of the sacrificial gate conductor of the sacrificial gate structures. The sacrificial gate conductor may then be removed by an etch that is selective to the high voltage dielectric layer 35 that is present on the fins structures 35a, 35b. The etch may also be selective to the gate sidewall spacers. Removing the sacrificial gate conductor provides a gate structure opening to the high voltage dielectric layer on the channel region portion of the first plurality of fin structures 30a, and the second plurality of fin structures 30b.

Figure 6:
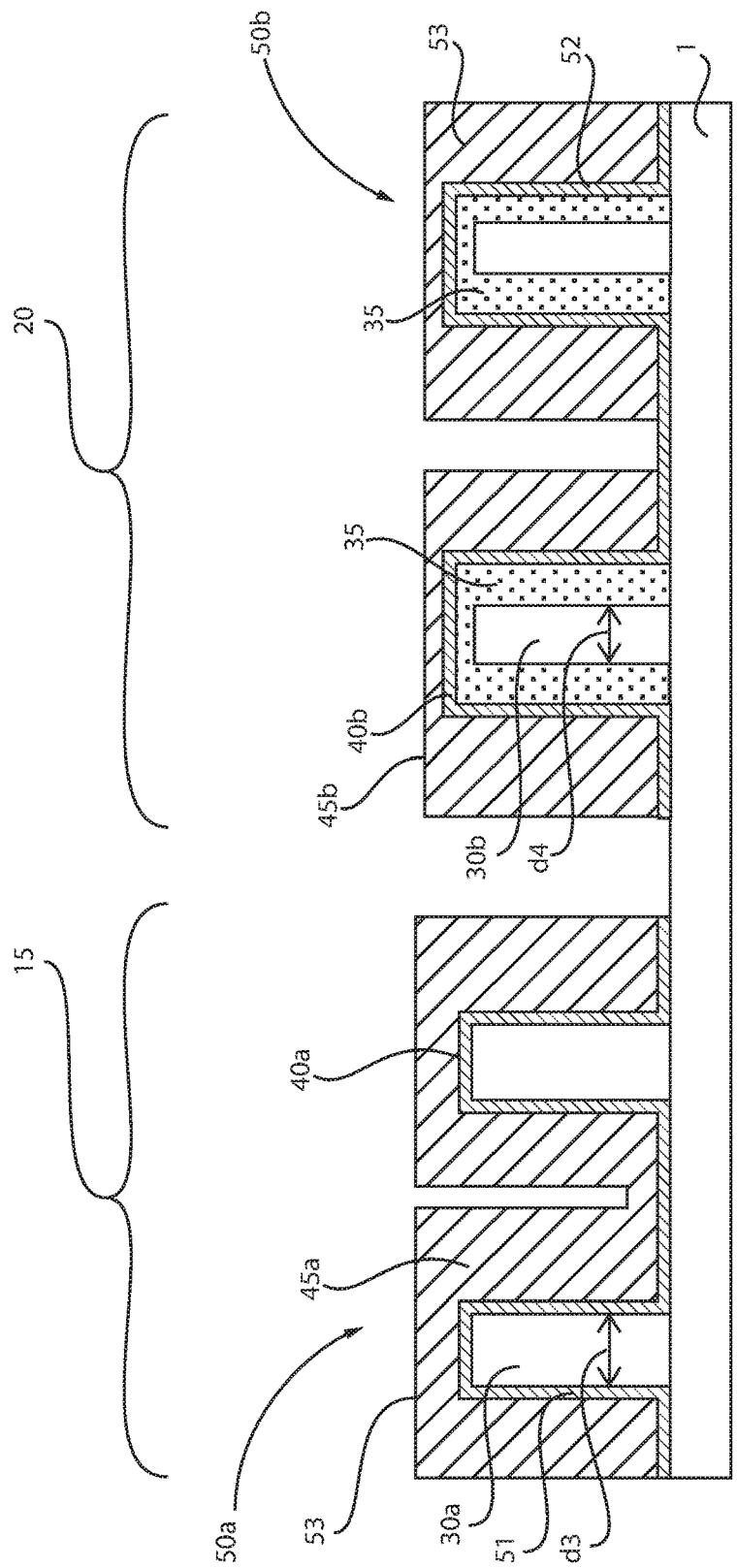
FIG. 6 is a side cross-sectional view depicting forming a first gate structure on the first plurality of fin structures having the first width including a first high-k gate dielectric that is in direct contact with a channel region of the first plurality of fin structures and a first gate conductor; and forming a second gate structure on the second plurality of fin structures including an oxide gate dielectric that is in direct contact with a channel region of the second plurality of fin structures, a second high-k gate dielectric and a second gate conductor, in accordance with one embodiment of the present disclosure.

Referring to FIG. 6, a first functional gate structure 50a is formed on the first plurality of fin structures 30a having the first width D3, and a second functional gate structure 50b is formed on the second plurality of fin structures 30b having the second width D4. The first functional gate structure 50a is formed after the high voltage dielectric layer 35 is removed from the first plurality of fin structures 30a. The first functional gate structure 50a includes a first high-k gate dielectric 51 that is in direct contact with a channel region of the first plurality of fin structures 30a, and a first gate conductor 52. The second functional gate structure 50b that is present on the second plurality of fin structures 30b includes the high voltage dielectric layer 35 that is in direct contact with a channel region of the second plurality of fin structures 30b, a second high-k gate dielectric 53 and a second gate conductor 54.

Forming the first and second functional gate structures 50a, 50b may start with removing the high voltage dielectric layer 35 from the first plurality of fin structures 30a. The high voltage dielectric layer 35 may be removed using an etch process that is selective to the first plurality of fin structures 30a. To protect the high voltage dielectric layer 35 that is present on the second plurality of fin structures 30b while the high voltage dielectric layer 35 is removed from the first plurality of fin structures 30a, an etch mask may be formed over the second region 25 of the substrate 1 covering the portion of the high voltage dielectric layer 35 that is present therein. The etch mask leaves the first region 15 of the substrate 1, as well as the portion of the high voltage dielectric layer 35 exposed. The etch mask may be composed of a photoresist material that is patterned using photolithography. The etch mask is similar to the block mask 25 that is depicted in FIG. 2. Therefore, the above description of the block mask 25 that is depicted in FIG. 2 is suitable for describing the etch mask.

Following the formation of the etch mask protecting the high voltage dielectric layer 35 that is present in the second region 25, a selective etch may remove the high voltage dielectric layer from the first region 15 of the substrate 1. The etch process for removing the high-voltage dielectric layer may be an anisotropic etch or an isotropic etch that is substantially selective to the first plurality of fin structures 30a and the etch mask. Examples of etch processes that are suitable at this stage of the present process include gaseous etching, plasma etching, reactive ion etching (RIE), wet etching and combinations thereof. Removing the high voltage dielectric layer 35 from the first region 15 of the substrate exposes the channel region of the first plurality of fin structures 30a.

In some embodiments, the etch process for removing the high voltage dielectric layer 35 may also remove material from the first plurality of fin structures 30a. As noted above, the width D4 of each fin structure in the second plurality of fin structures 30b is less than the width D3 of the first plurality of fin structures 30a. In some embodiments, the etch that removes some material from the first plurality of fin structures 30a may reduce the width W3 of the fin structures in the first plurality of fin structures 30a to be approximately equal to the width W4 of the fin structures in the second plurality of fin structures 30b. In other embodiments, the width W3 of the fin structures in the first plurality 30a remains larger than the width W4 of the fin structures in the second plurality of fin structures W4.

After removing the high voltage dielectric layer 35 from the first plurality of fin structures 30b, the etch mask may be removed. The etch mask may be removed using selective etching, chemical stripping or oxygen ashing.

Following removal of the high voltage dielectric layer 35 from the first plurality of fin structures 30b, a high-k gate dielectric layer 51, 52 may be formed over the channel region of the first and second plurality of fin structures 30a, 30b. The high-k gate dielectric layer 51 that is formed on the first plurality of fin structures 30a may be formed in direct contact with the channel region of the first plurality of fin structures 30a. The high-k gate dielectric layer 52 that is formed on the second plurality of fin structures 30b may be formed directly on the high voltage dielectric layer 35 that is in direct contact with the channel region of the second plurality of fin structures 30b. In some embodiments, the term "high-k" denotes a dielectric material having a dielectric constant greater than silicon oxide ($SiO_2$) at room temperature (20° C. to 25° C.) and atmospheric pressure (1 atm). For example, a high-k dielectric material may have a dielectric constant greater than 4.0. In another example, the high-k gate dielectric material has a dielectric constant greater than 7.0. In one embodiment, the high-k dielectric layer 51, 52 that is formed on the first and second plurality of fin structures 30a, 30b is composed of a high-k oxide, such as, for example, $HfO_2$, $ZrO_2$, $Al_2O_3$, $TiO_2$, $La_2O_3$, $SrTiO_3$, $LaAlO_3$, $Y_2O_3$ and mixtures thereof. Other examples of high-k dielectric materials for the high-k dielectric layers 51, 52 that are formed on the first and second plurality of fin structures 30a, 30b include hafnium silicate, hafnium silicon oxynitride or combinations thereof. In one embodiment, the high-k dielectric layer 51, 52 that are formed on the first and second plurality of fin structures 30a, 30b may be deposited by chemical vapor deposition (CVD). Variations of CVD processes suitable for depositing the high-k dielectric layer 51, 52 on the first and second plurality of fin structures 30a, 30b include, but are not limited to, APCVD, LPCVD, PECVD, MOCVD, ALD, and combinations thereof. In one embodiment, the thickness of the high-k dielectric layers 51, 52 is greater than 0.8 nm. More typically, the high-k dielectric layers 51, 52 have a thickness ranging from about 1.0 nm to about 60 nm.

Still referring to FIG. 6, the method may continue with forming the functional gate structure 53, 54 for the first and second plurality of fin structures 30a, 30b. The conductive material of the gate conductor may comprise polysilicon, SiGe, a silicide, a metal or a metal-silicon-nitride such as Ta—Si—N. Examples of metals that can be used as the gate conductor include, but are not limited to, Al, W, Cu, and Ti or other like conductive metals. The layer of conductive material for the gate conductor may be doped or undoped. If doped, an in-situ doping deposition process may be employed. Alternatively, a doped conductive material can be formed by deposition, ion implantation and annealing. The at least one gate conductor may be formed using a deposition process. For example, when the at least one gate conductor is composed of a semiconductor material, the at least one gate conductor may be formed using may be formed using a deposition process, such as chemical vapor deposition (CVD). In another embodiment, when the at least one gate conductor is composed of a metal, the at least one gate conductor is formed using a physical vapor deposition (PVD) process, such as sputtering. Examples of sputtering apparatus that may be suitable for depositing the at least one gate conductor include DC diode type systems, radio frequency (RF) sputtering, magnetron sputtering, and ionized metal plasma (IMP) sputtering.

In some embodiments, because the width D4 of the second plurality of fin structures 30b has been reduced prior to forming the high voltage dielectric layer 35, the functional gate structure including the high voltage dielectric layer 35, the high-k gate dielectric layer 52 and the gate conductor 52 is resistant to pinch off effects.

FIGS. 7-10 depict another embodiment of the present disclosure. In the embodiment that is depicted in FIGS. 7-10, the width D5 of the fin structures 30d for the high-voltage semiconductor devices has been reduced by isotropically etching a second plurality of fin structures 30d, while a first plurality of fin structures 30c being used for the low voltage semiconductor devices is being protected by a block mask 25.

Figure 7:
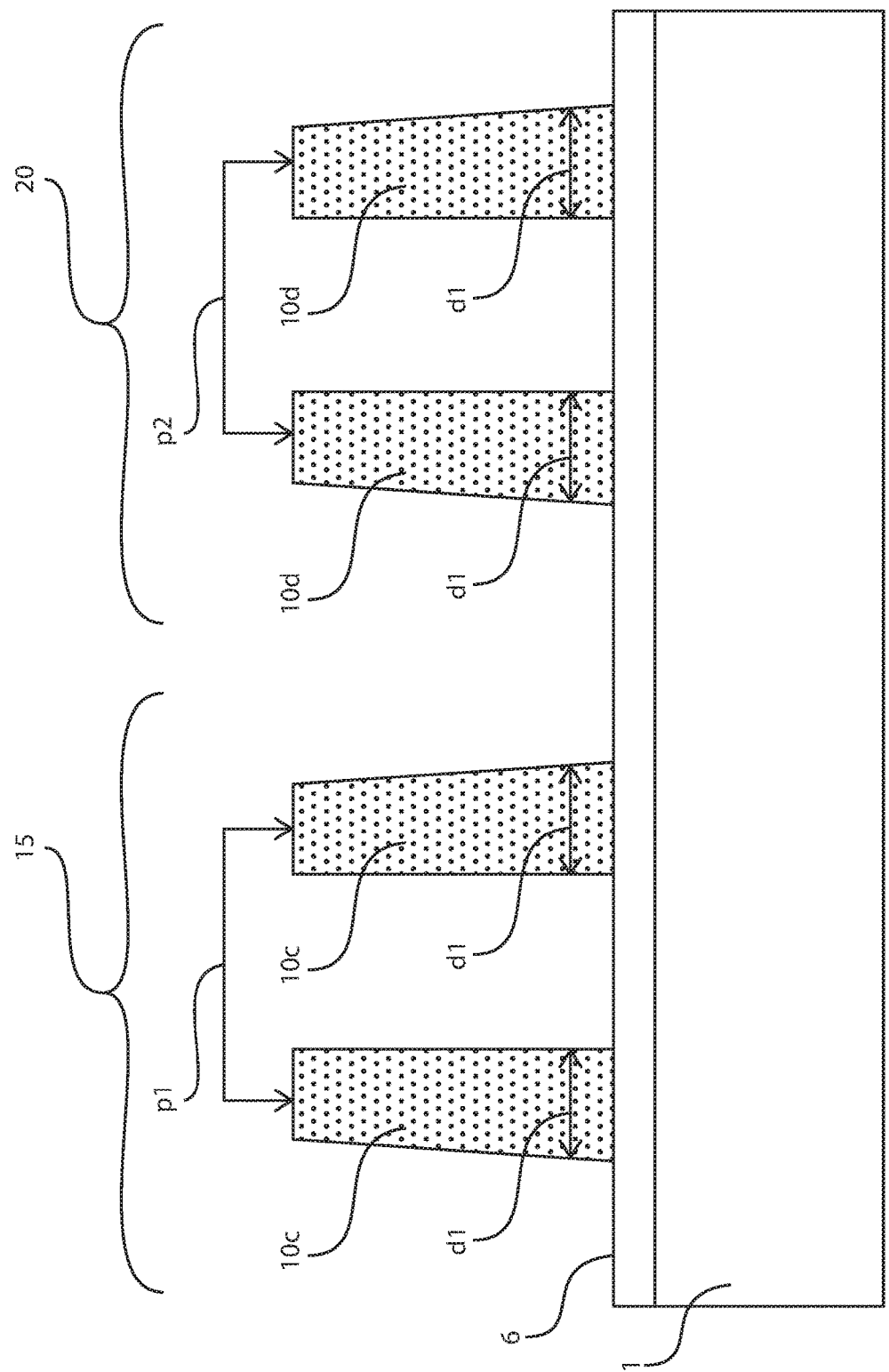
FIG. 7 is a side cross-sectional view of forming a plurality of spacers using spacer image transfer over a semiconductor containing substrate for being patterned into fin structures, in accordance with another embodiment of the present disclosure.

FIG. 7 depicts forming a plurality of spacers 10c, 10d using spacer image transfer over a semiconductor containing substrate 1 for being patterned into fin structures. The plurality of spacers 10c, 10d, that are depicted in FIG. 7 are similar to the plurality of spacers 10a, 10b that are depicted in FIG. 1. Therefore, the description of the plurality of spacers 10a, 10b, as well as the spacer image transfer (SIT) method for forming the plurality of spacers 10a, 10b that are depicted in FIG. 1, are suitable for the description of the plurality of spacers 10c, 10d that are depicted in FIG. 7. For example, the width D1 and pitch P1, P2 of the spacers 10a, 10b depicted in FIG. 1 is suitable for the width D1 and pitch of the spacers 10a, 10b that are depicted in FIG. 7. The semiconductor substrate 1 that is depicted in FIG. 7 has also been described above with reference to FIG. 1.

Figure 8:
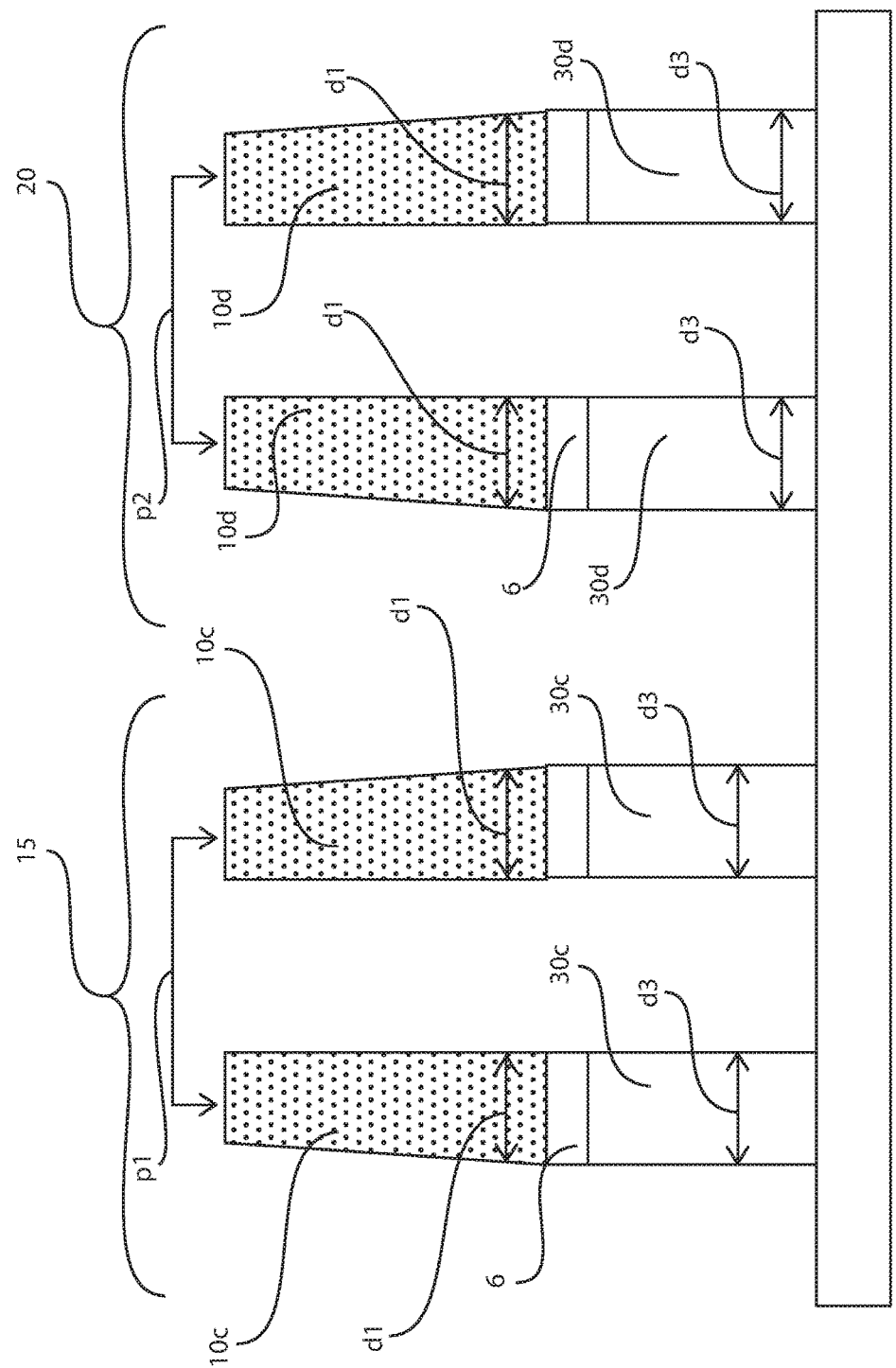
FIG. 8 is a side cross-sectional view of etching a plurality of fin structures into the semiconductor containing substrate using the plurality of spacers as an etch mask, wherein each of the fin structures have a first width, in accordance with another embodiment of the present disclosure.

FIG. 8 depicts etching a plurality of fin structures 30c, 30d into the semiconductor containing substrate 1 using the plurality of spacers 10a, 10b as an etch mask, wherein each of the fin structures 30c, 20d has a first width D3. In this embodiment, the plurality of spacers 10a, 10b are not isotropically etched before patterning the semiconductor substrate 1 to provide the first and second plurality of fin structures 30c, 30d. Therefore, all of the fin structures 30c, 30d may have the same width D3 at this stage of the process. The semiconductor substrate 1 may be etched with an anisotropic etch, such as reactive ion etch (RIE), plasma etching, laser ablation, and combinations thereof. The width D3 of the fin structures 30c, 30d at this stage of the process flow may range from 5 nm to 20 nm. The height of the fin structures 30c, 30d at this stage of the process flow may range from 20 nm to 50 nm. Dielectric regions (not shown) may be formed between the adjacent fin structures providing isolation. Following fin structures 30c, 30d, the dielectric spacers 10c, 10d may be removed by selective etching, chemical stripping or oxygen ashing.

Figure 9:
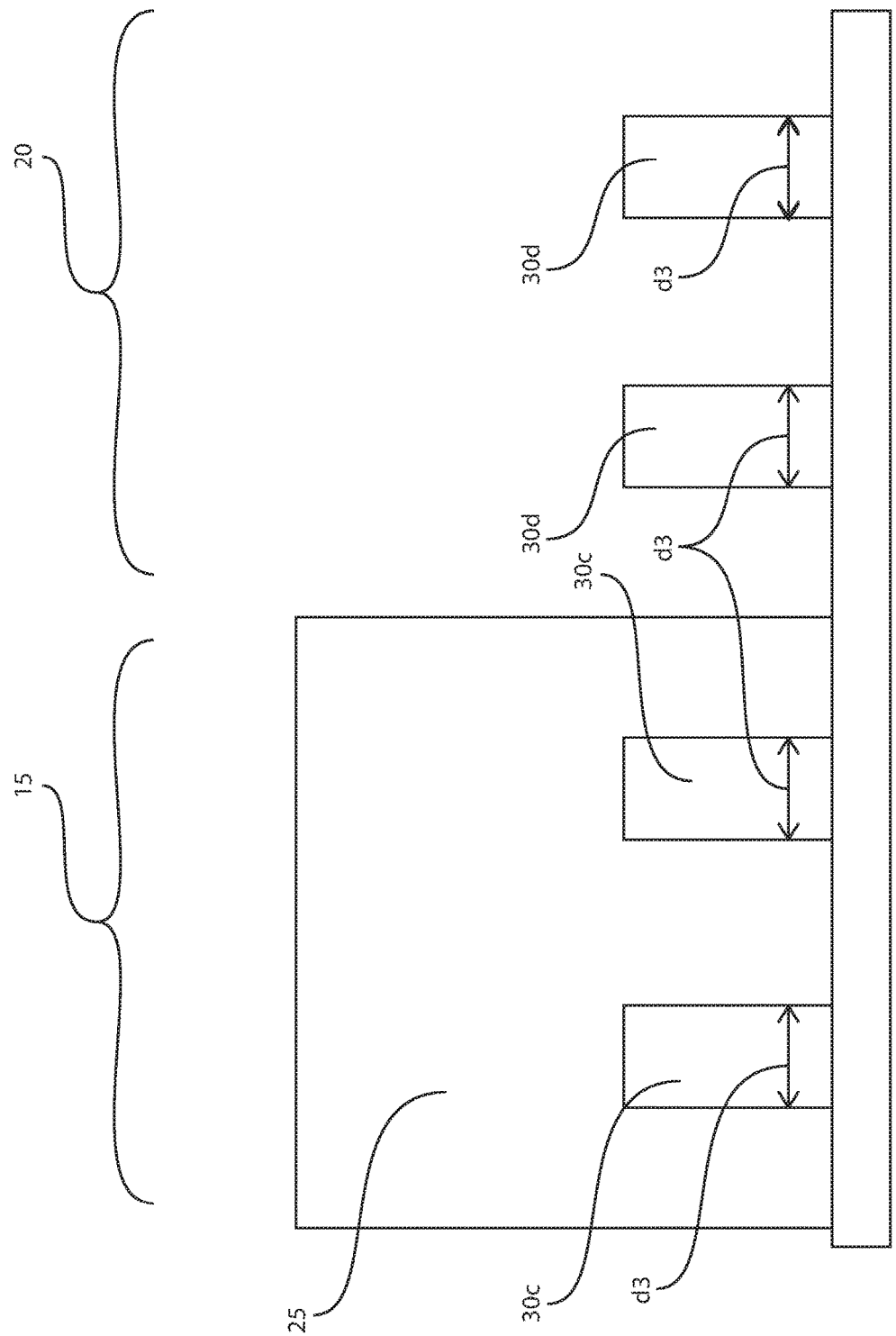
FIG. 9 is a side cross-sectional view depicting forming a block mask over a first grouping of fin structures in a first region of the semiconductor substrate, in accordance with one embodiment of the present disclosure.

FIG. 9 depicting forming a block mask 25 over a first grouping of fin structures 30c in a first region 15 of the semiconductor substrate 1, in which the second grouping of fin structures 30d in the second region 25 of the semiconductor substrate 1 are not covered by the block mask 25 and remains exposed. The block mask 25 depicted in FIG. 9 is similar to the block mask 25 that is depicted in FIG. 2. Therefore, the description of the block mask 25 that is depicted in FIG. 2 is applicable for the description of the block mask 25 depicted in FIG. 9.

Figure 10:
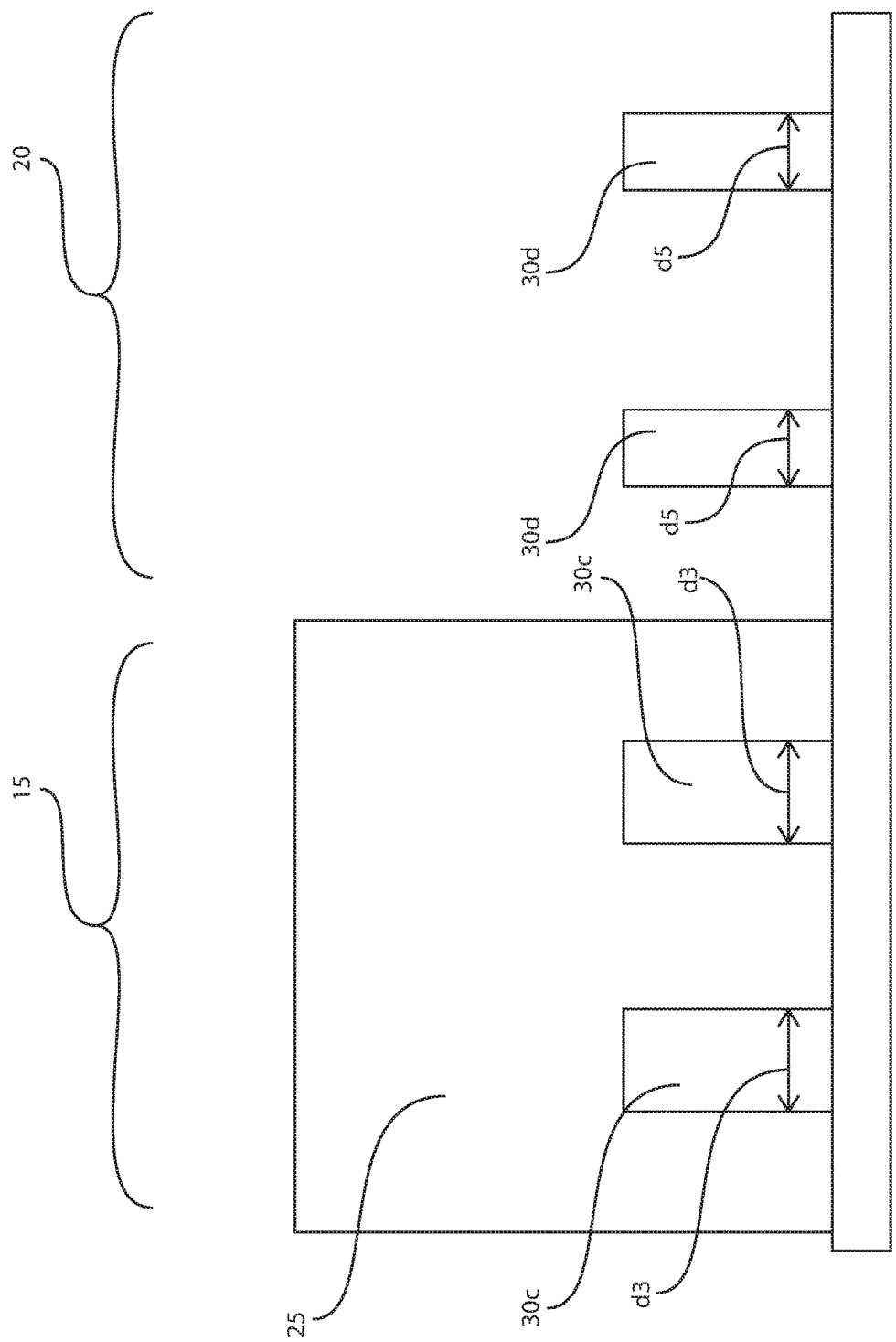
FIG. 10 is a side cross-sectional view depicting one embodiment of an isotropic etch being applied to a second grouping of fin structures not covered by the block mask, wherein the isotropic etch reduces a width of at least one fin structure in the second group of fin structures to a second width that is less than the first width, in accordance with present disclosure.

FIG. 10 depicts one embodiment of an isotropic etch being applied to a second grouping of fin structures 30d not covered by the block mask 25, wherein the isotropic etch reduces a width of at least one fin structure in the second group of fin structures 30d to a second width D5 that is less than the first width D3. One example of isotropic etching processes suitable for etching the second group of fin structures 30d to the second width D5 may be plasma etching. In one embodiment, the isotropic etching of the second group of fin structures 30d may laterally remove 1 nm to 4 nm from each sidewall of each fin structure, which reduces the overall width of each of the fin structure in the second group of fin structures 30d by 2 nm to 8 nm. In another embodiment, the isotropic etching of the second group of fin structures 30d may laterally remove 2 nm to 3 nm from each sidewall of each fin structure, which reduces the overall width of each of the fin structures in the second group of fin structures 30d by 4 nm to 6 nm. In some embodiment, the second width D5 for each of the fin structures 30d at this stage of the present disclosure may be less than 15 nm, as measured at the base of the fin structure 30d. In another embodiment, the fin structures 30d have a width D5 that is less than the first width D3.

Following reducing the width of the second plurality of fin structures 30c, the first plurality of fin structures 30c may be further processed to provide low voltage semiconductor devices, and the second plurality of fin structures 30d may be processed to provide high voltage semiconductor devices. For example, a high voltage dielectric layer may be formed on each of the first and second plurality of fin structures, as described above with reference to FIG. 5. Sacrificial gate structures may then be formed on each of the fin structures 30c, 30d, as described above. Source and drain regions may then be formed for each of the fin structures. The sacrificial gate structures may then be removed. Following the removal of the sacrificial gate structures, the high voltage dielectric layer may be removed from the channel region of the first plurality of fin structures 30c that provide the low voltage semiconductor device in the first region of the substrate 15. Functional gate structures are then formed for each of the first and second plurality of fin structures 30c, 30d, as described above with reference to FIG. 6.

For example, a high-k gate dielectric layer may be formed over the channel region of the first and second plurality of fin structures 30c, 30d. The high-k gate dielectric layer that is formed on the first plurality of fin structures 30c may be formed in direct contact with the channel region of the first plurality of fin structures 30c. The high-k gate dielectric layer that is formed on the second plurality of fin structures 30d may be formed directly on the high voltage dielectric layer that is in direct contact with the channel region of the second plurality of fin structures 30d. The description of the high-k dielectric layers identified by reference numbers 51, 52 in FIG. 6 are suitable for use with the embodiments of the present disclosure using the fin structures 30c, 30d described with reference to FIGS. 7-10. The method may continue with forming the conductive material of the gate conductor for the functional gate structure for each of the first and second plurality of fin structures 30c, 30d. The gate conductors identified by reference numbers 53 and 54 in FIG. 6 are suitable for use with the embodiments of the present disclosure using the fin structures 30c, 30d described with reference to FIGS. 7-10.

In another embodiment, the process sequence for forming the finFET structure depicted in FIGS. 1-10 is formed using a gate first process sequence, which is not depicted in the supplied figures. The method depicted in FIGS. 1-10 is a gate last process that includes forming a replacement gate structure. In another embodiment, a functional gate structure is formed instead of a replacement gate structure, and the functional gate structure remains throughout the formation of the fin structure. This is referred to as a gate first process sequence. Both gate first and gate last process sequences are applicable to the present disclosure.

As depicted in FIGS. 1-10, a semiconductor device is provided that includes a first plurality of fin structures 30a, 30c having a first width d3 in a first region 15 of a substrate 1, and a second plurality of fin structures 30b, 30d having a second width d4, d5 in a second region 25 of the substrate 1, in which second width d4, d5 is less than the first width d3. In some embodiments, the first plurality of fin structures 30a, 30c and the second plurality of fin structures 30b, 30d have substantially the same pitch P1, P2.

A first gate structure 50a is formed on the first plurality of fin structures 30a, 30c, and a second gate structure 50b is formed on the second plurality of fin structures 30b, 30d. Although FIG. 6 only depicts the gate structures 50a, 50b being formed on the first and second plurality of fin structures 30a, 30b that have been formed by the process sequence depicted in FIGS. 1-6, the gate structures 50a, 50b depicted in FIG. 6 may equally be present on the plurality of fin structures 30c, 30d formed using the method described with reference to FIGS. 1-10.

The first gate structure 50a includes a first high-k gate dielectric 51 that is in direct contact with a channel region of the first plurality of fin structures 30a, 30c and a first gate conductor 53. A second gate structure 50b is formed on the second plurality of fin structures 30 including an oxide gate dielectric 35, also referred to as a high voltage gate dielectric 35, that is in direct contact with a channel region of the second plurality of fin structures 30b, 30d, a second high-k gate dielectric 52 and a second gate conductor 54.

The first gate structure 50a may provide the gate structure for a low voltage semiconductor device, such as a low voltage FinFET. In one example, the low voltage Fin Field Effect Transistors that may include the first plurality of fin structures 30a, 30c and the first gate structure 50a have an applied voltage of less than 1.2 V. The second gate structure 50b may provide the gate structure for a high voltage semiconductor device, such as a high voltage FinFET. In one example, the high voltage Fin Field Effect Transistors that may include the second plurality of fin structures 30b, 30d and the first gate structure 50b have an applied voltage of more than 2.0 eV.

While the methods and structures of the present disclosure have been particularly shown and described with respect to preferred embodiments thereof, it will be understood by those skilled in the art that the foregoing and other changes in forms and details may be made without departing from the spirit and scope of the present disclosure. It is therefore intended that the present disclosure not be limited to the exact forms and details described and illustrated, but fall within the scope of the appended claims.

What is claimed is:

1. A method of forming a semiconductor device comprising:
   forming a plurality of fin structures from a semiconductor substrate using spacer image transfer, wherein each fin structure in the plurality of fin structures has a first width;
   forming a block mask over a first grouping of the plurality of fin structures; and
   applying an isotropic etch to a second grouping of the plurality of fin structures not covered by the block mask, wherein the isotropic etch reduces a width of at least one fin structure in the second group of fin structures to a second width that is less than the first width, wherein the first plurality of fin structures having the first width provides a channel region for semiconductor devices having a first applied voltage, and the second plurality of fin structures having said second width provides a channel region for semiconductor devices having a second applied voltage that is greater than the first applied voltage.

2. The method of claim 1 further comprising forming a high voltage dielectric layer on said second plurality of fin structures.

3. The method of claim 2, wherein forming the high voltage dielectric layer comprises blanket depositing said high voltage dielectric layer on said first plurality of fin structures and said second plurality of fin structures, and removing the high voltage dielectric layer from the first plurality of fin structures using a selective etch.

4. The method of claim 2, wherein the high voltage dielectric layer is an oxide.

5. The method of claim 4, wherein the high voltage dielectric layer has a thickness ranging from 3 nm to 7 nm.

6. The method of claim 3, further comprising forming a first high-k gate dielectric layer directly on the channel region of the first plurality of fin structures, and forming a second high-k dielectric layer directly on the high voltage dielectric layer that is present directly on the channel region of the second plurality of fin structures.

7. The method of claim 6, further comprising forming a gate conductor on the first and second high-k gate dielectric layers.

8. The method of claim 6, wherein the first applied voltage is less than 1.2 eV, and the second applied voltage is greater than 2.0 eV.

9. A method of forming a semiconductor device comprising:
   forming a plurality of fin structures from a semiconductor substrate, wherein each fin structure in the plurality of fin structures has a first width;
   forming a block mask over a first grouping of the plurality of fin structures; and
   applying an isotropic etch to a second grouping of the plurality of fin structures not covered by the block mask, wherein the isotropic etch reduces a width of at least one fin structure in the second group of fin structures to a second width that is less than the first width, wherein the first plurality of fin structures having the first width provides a channel region for semiconductor devices having a first applied voltage, and the second plurality of fin structures having said second width provides a channel region for semiconductor devices having a second applied voltage that is greater than the first applied voltage.

10. The method of claim 9, further comprising forming a high voltage dielectric layer on said second plurality of fin structures.

11. The method of claim 10, wherein forming the high voltage dielectric layer comprises blanket depositing said high voltage dielectric layer on said first plurality of fin structures and said second plurality of fin structures, and removing the high voltage dielectric layer from the first plurality of fin structures using a selective etch.

12. The method of claim 10, wherein the high voltage dielectric layer is an oxide.

13. The method of claim 12, wherein the high voltage dielectric layer has a thickness ranging from 3 nm to 7 nm.

14. The method of claim 11, further comprising forming a first high-k gate dielectric layer directly on the channel region of the first plurality of fin structures, and forming a second high-k dielectric layer directly on the high voltage dielectric layer that is present directly on the channel region of the second plurality of fin structures.

15. The method of claim 14, further comprising forming a gate conductor on the first and second high-k gate dielectric layers.

16. The method of claim 15, wherein the first applied voltage is less than 1.2 eV, and the second applied voltage is greater than 2.0 eV.

17. A method of forming a semiconductor device comprising:
   forming a plurality of fin structures from a semiconductor substrate using spacer image transfer, wherein each fin structure in the plurality of fin structures has a first width; and
   applying an isotropic etch to a second grouping of the plurality of fin structures, wherein the isotropic etch reduces a width of at least one fin structure in the second group of fin structures to a second width that is less than the first width, wherein the first plurality of fin structures having the first width provides a channel region for semiconductor devices having a first applied voltage, and the second plurality of fin structures having said second width provides a channel region for semiconductor devices having a second applied voltage that is greater than the first applied voltage.

18. The method of claim 17, further comprising forming a high voltage dielectric layer on said second plurality of fin structures.

\* \* \* \* \*